US011022886B2

(12) United States Patent
Weng et al.

(10) Patent No.: US 11,022,886 B2
(45) Date of Patent: Jun. 1, 2021

(54) BOTTOM-UP MATERIAL FORMATION FOR PLANARIZATION

(71) Applicant: Taiwan Semiconductor Manufacturing Co., Ltd., Hsinchu (TW)

(72) Inventors: Ming-Hui Weng, New Taipei (TW); Cheng-Han Wu, Taichung (TW); Ching-Yu Chang, Yilang County (TW); Chin-Hsiang Lin, Hsin-chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 260 days.

(21) Appl. No.: 15/597,734

(22) Filed: May 17, 2017

(65) Prior Publication Data
US 2018/0337036 A1 Nov. 22, 2018

(51) Int. Cl.
G03F 7/16 (2006.01)
H01L 21/02 (2006.01)
H01L 21/321 (2006.01)
H01L 21/308 (2006.01)
H01L 21/027 (2006.01)
H01L 21/3105 (2006.01)
G03F 7/039 (2006.01)
G03F 7/38 (2006.01)
H01L 21/311 (2006.01)

(52) U.S. Cl.
CPC ............ *G03F 7/168* (2013.01); *G03F 7/0392* (2013.01); *G03F 7/38* (2013.01); *H01L 21/0271* (2013.01); *H01L 21/02118* (2013.01); *H01L 21/02282* (2013.01); *H01L 21/02304* (2013.01); *H01L 21/3081* (2013.01); *H01L 21/31055* (2013.01); *H01L 21/32115* (2013.01); *H01L 21/31133* (2013.01)

(58) Field of Classification Search
CPC ........... G03F 7/168; G03F 7/38; G03F 7/0392
See application file for complete search history.

(56) References Cited

U.S. PATENT DOCUMENTS

| 6,461,796 B1* | 10/2002 | Kunikiyo ............ H01L 21/0273 430/313 |
| 6,645,851 B1* | 11/2003 | Ho ........................ G03F 7/0035 257/E21.026 |
| 8,796,666 B1 | 8/2014 | Huang et al. |
| 9,012,132 B2 | 4/2015 | Chang |
| 9,028,915 B2 | 5/2015 | Chang et al. |
| 9,093,530 B2 | 7/2015 | Huang et al. |
| 9,146,469 B2 | 9/2015 | Liu et al. |
| 9,213,234 B2 | 12/2015 | Chang |
| 9,223,220 B2 | 12/2015 | Chang |
| 9,256,133 B2 | 2/2016 | Chang |
| 9,536,759 B2 | 1/2017 | Yang et al. |
| 9,548,303 B2 | 1/2017 | Lee et al. |
| 2016/0181100 A1* | 6/2016 | deVilliers et al. ........ G03F 7/20 |
| 2017/0176859 A1* | 6/2017 | Kim et al. .......... H01L 21/0337 |

FOREIGN PATENT DOCUMENTS

WO    WO 2005/038878    *   4/2005

* cited by examiner

Primary Examiner — Daborah Chacko-Davis
(74) Attorney, Agent, or Firm — Haynes and Boone, LLP

(57) ABSTRACT

The present disclosure provides a method for planarization. The method includes providing a substrate having a top surface and a trench recessed from the top surface; coating a sensitive material layer on the top surface of the substrate, wherein the sensitive material layer fills in the trench; performing an activation treatment to the sensitive material layer so that portions of the material layer are chemically changed; and performing a wet chemical process to the sensitive material layer so that top portions of the sensitive material layer above the trench are removed, wherein remaining portions of the sensitive material layer have top surfaces substantially coplanar with the top surface of the substrate.

20 Claims, 13 Drawing Sheets

BOTTOM-UP MATERIAL FORMATION FOR PLANARIZATION

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, planarization requirement has generally increased while geometry size (i.e., the smallest component or line that can be created using a fabrication process) has decreased. This is caused by various factors including the depth of focus (DOF) and lithography patterning resolution. As the feature sizes decrease, a pattern to be formed by a lithography projection system is more sensitive to focus error. The depth of focus is related to the range of focus errors that a process can tolerate with an acceptable resolution. In other words, when the feature sizes get smaller, the lithography imaging resolution is required to increase, and the DOF is reduced. This requires a wafer top surface to be planarized to meet the DOF requirement. Various approaches are used, tested, or proposed to improve the planarization of the wafer surface to keep up meet the DOF and resolution requirements during fabrications.

However, the existing methods are still not satisfactory when making much smaller feature sizes. Also, existing methods are further complicated with non-uniform pattern loading cross the wafer. What is needed is a method and materials utilized by the method to have improvements in this area and address the above issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
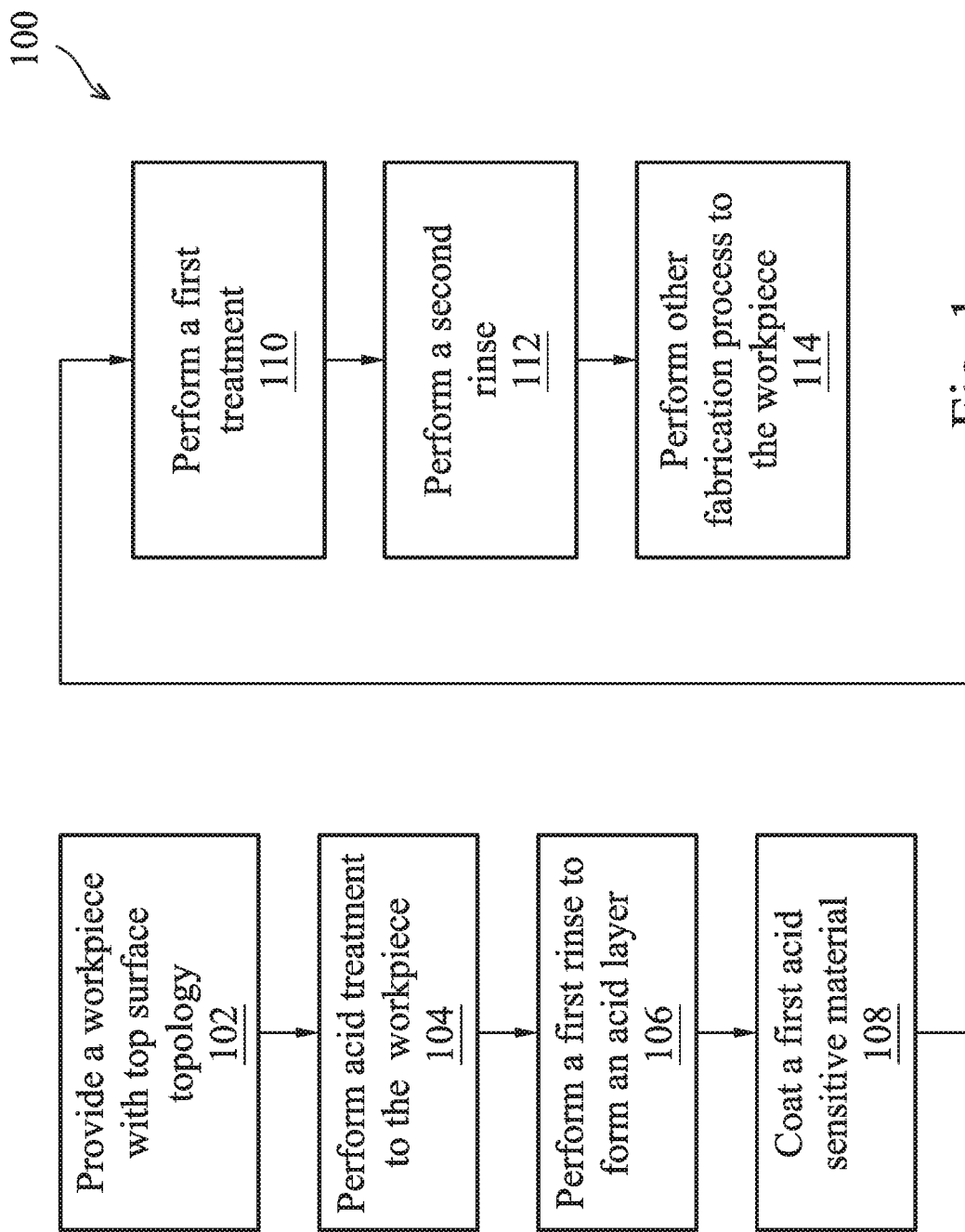
FIG. 1 illustrates a flow chart of a lithography patterning method in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to methods for semiconductor device fabrication, and more particularly to planarization method in various fabrications including lithography patterning. In lithography patterning, a resist film is exposed to radiation energy, such as ultraviolet (UV), deep UV (DUV) or extreme UV (EUV) radiation energy, it is developed in a developer (a chemical solution) to form a patterned resist layer being used for various patterning process, such as being used in etching as an etch mask or in ion implantation as an implantation mask. When a main pattern (such as circuit pattern) is imaged on the photosensitive film during the exposing process, the imaging resolution is determined by the depth of focus (DOF). The better imaging resolution requires the photosensitive film is thin and flat, which further requires the underlying material layer is planarized. However, the underlying material layer is usually a patterned material layer with a circuit pattern defined thereon, the top surface is uneven with various regions with different depths. The existing methods are not satisfying to planarize the top surface due to various factors, including uneven pattern densities and feature dimensions, degrading the planarization effect by the pattern loading effect. The planarization is also implemented in other fabrication steps, such as formation of shallow trench isolation and interlayer dielectric deposition. The present disclosure provides a method for bottom-up material formation with improved planarization in various embodiments. This method can be implemented in various above fabrication steps but is not limited to those. The method is described below in exemplary structures for illustration purpose.

FIG. 1 is a flow chart of a method 100 of patterning a substrate (e.g., a semiconductor wafer) according to various aspects of the present disclosure in some embodiments. Additional operations can be provided before, during, and after the method 100, and some operations described can be replaced, eliminated, or moved around for additional embodiments of the method.

FIGS. 2A through 2E are sectional views of a semiconductor structure 200 at various fabrication stages, constructed in accordance with some embodiments. The method 100 is described below in conjunction with FIG. 1 and FIGS. 2A through 2E wherein the semiconductor structure 200 is fabricated by using embodiments of the method 100. The semiconductor structure 200 may be an intermediate workpiece fabricated during processing of an IC, or a portion thereof, that may include logic circuits, memory structures, passive components (such as resistors, capacitors, and inductors), and active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, fin-like FETs (FinFETs), other three-dimensional (3D) FETs, other memory cells, or combinations thereof.

Figure 2B:
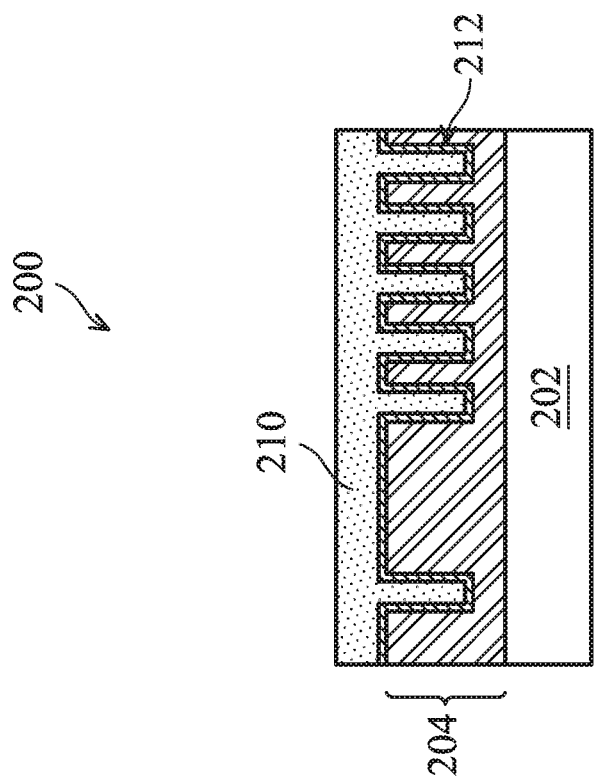
FIGS. 2A, 2B, 2C, 2D, 2E and 2F illustrate cross sectional views of a semiconductor structure at various fabrication stages, in accordance with some embodiments.
Figure 2A:
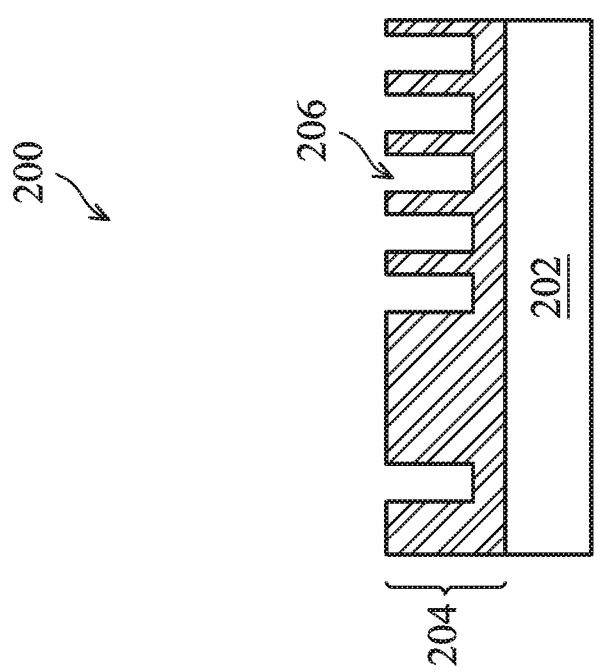

Referring now to FIG. 1 in conjunction with FIG. 2A, the method 100 begins at block 102 with a semiconductor structure 200. Referring to FIG. 2A, the semiconductor structure 200 includes a substrate 202. In an embodiment, the substrate 202 is a semiconductor substrate (e.g., wafer). For example, the substrate 202 includes silicon in a crystalline structure. In alternative embodiments, the substrate 202 includes other elementary semiconductors such as germanium, or a compound semiconductor such as silicon carbide, gallium arsenide, indium arsenide, and indium phosphide. The substrate 202 includes one or more layers of material or composition. The substrate 202 may include a silicon on insulator (SOI) substrate, be strained/stressed for performance enhancement, include epitaxial regions, include isolation regions, include doped regions, include one or more semiconductor devices or portions thereof, include conductive and/or non-conductive layers, and/or include other suitable features and layers.

A pattern layer 204 is disposed on the substrate 202. The pattern layer 204 includes various features separated by various trenches or recessed areas 206. Those features may have different shapes, dimensions, heights, and/or densities. In some examples, the pattern layer 204 is semiconductor material that defines fin active regions, wherein various FinFETs are formed on. In this case, the fin active regions are extruded from the semiconductor substrate. In some examples, the pattern layer 204 is conductive material that defines gate electrodes for FinFETs or metal lines for interconnections. The pattern layer 204 and the substrate 202 may be also collectively referred to as substrate.

Referring now to FIG. 1 in conjunction with FIG. 2B, the method 100 proceeds to operation 104 to perform an acid treatment to the pattern layer 204. In the operation 104, an acid solution (the solution containing acid or alternatively the solution capable of generating acid), acid liquid or other suitable acid material 210 is applied to the pattern layer 204 by a proper technique, such as spin-on coating. The acid solution is disposed on the pattern layer 204 and fills in the trenches 206. An acid layer 212 is formed between the acid solution 210 and the pattern layer 204 and is conformal to the topology of the pattern layer 204. Particularly, the acid layer 212 is directly formed on the top surfaces of the pattern layer 204, including various surfaces of the trenches 206. In the present embodiment, the acid layer 212 is a thin portion of the acid solution that is adhered on the top surfaces and remained thereon after the subsequent rinse. In some embodiments, the acid layer 212 may be a different layer formed by the interaction between the acid solution 210 and the pattern layer 204 or other mechanism.

Figure 5B:
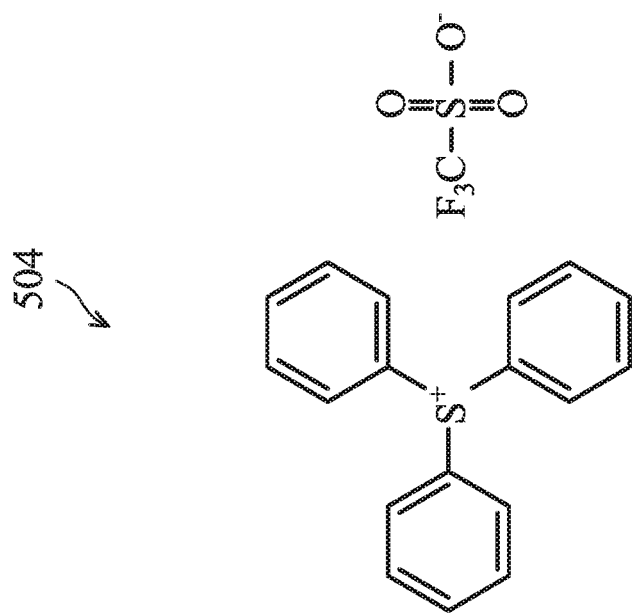
FIGS. 5A and 5B illustrate a chemical structure of a photo-acid generator in accordance with some embodiments.
Figure 5A:
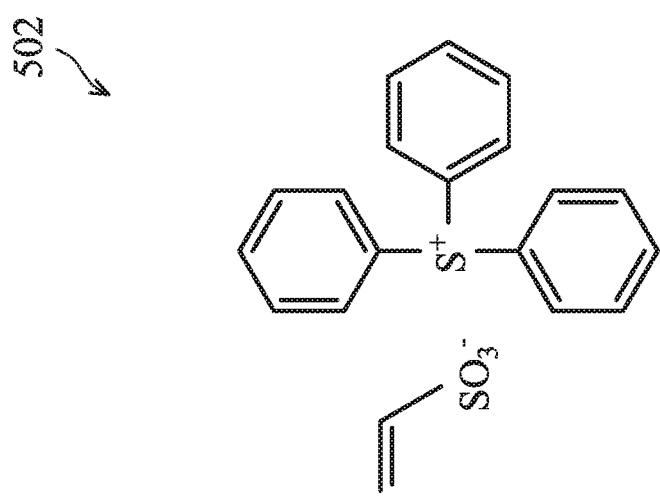

In some embodiments, the acid solution is a solution that includes photo-acid generator (PAG) mixed in a solvent, such as an organic solvent or an aqueous solvent. The PAG is able to release acid in response to radiation, such as UV light. In some embodiments, the PAG includes a phenyl ring. In a particular example, the PAG includes a sulfonium cation, such as a triphenylsulfonium (TPS) group; and an anion, such as a triflate anion. In some examples, the anion includes a sulfonyl hydroxide or fluoroalky sulfonyl hydroxide. FIGS. 5A and 5B provide exemplary chemical structures 502 and 504 of the PAG, respectively. In furtherance of the embodiments with PAG, the acid treatment further includes an optical exposing process to the acid solution so to generate acid. In this case, the optical exposing process is a blanket exposing process without patterning (without using photomask for example). The optical radiation used in the optical exposing process may UV, DUV or other suitable radiation, such as I-line light, a DUV light (e.g., 248 nm radiation by krypton fluoride (KrF) excimer laser or 193 nm radiation by argon fluoride (ArF) excimer laser). In one example, the optical exposing process may be implemented in a lithography projection system without using a photomask. Therefore, a low resolution lithography projection system is able to perform the optical exposing process for this purpose.

Figure 6B:
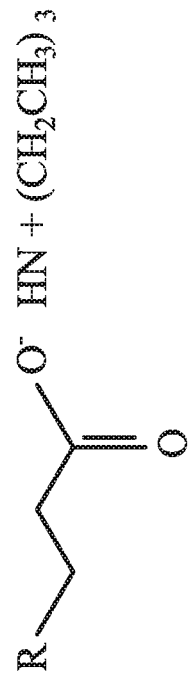
FIGS. 6A and 6B illustrate a chemical structure of a thermal-acid generator in accordance with some embodiments.
Figure 6A:
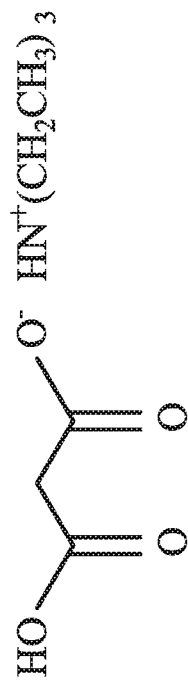
Figure 7B:
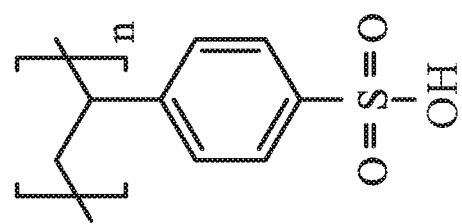
FIGS. 7A and 7B illustrate a chemical structure of an acid polymer in accordance with some embodiments.
Figure 7A:
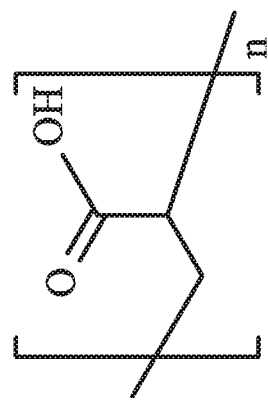

In some embodiments, the acid solution is a solution that includes thermal-acid generator (TAG) mixed in a solvent, such as an organic solvent or an aqueous solvent. The TAG is able to release acid in response to thermal energy, such as baking. In some embodiments, the TAG includes ionic thermal acid generators, such as sulfonate salts (such as fluorinated sulfonate salts or ammonium salts), chloroacetic acid, malonic acid, dichloroacetic acid, fumaric acid, oxalic acid, cinnamic acid, tartaric acid, gylcolic acid, cyanoacetic acid, gylcolic acid. FIGS. 6A and 6B provide exemplary catalyst structures 602 and 604 of the TAG, respectively. In the catalyst structure 604 of FIG. 6B, the functional group R may be an alkyl group with hydrogen attached or hydrocarbon with straight, branched, or cyclic structure. The alkyl group may also contain hetero atom, such as nitrogen, or oxygen for example. Alternatively, the carboxylic acid may be replaced by sulfonic acid or other acid functional group. In furtherance of the embodiments with TAG, the acid treatment further includes a thermal process, such as baking, to the acid solution so to generate acid. In those chemical structures 604 and 606, the amine will quench the acidity of acid functional group. When the amine is evaporated during the baking process, the acid is generated. In some embodiments, the acid material includes polymer, oligomer, or molecule with acid association constant pKa below 4, dissolved in a suitable solvent, such as PGMEA or PGME. FIGS. 7A and 7B provide exemplary acid polymers: poly acrylic acid 702 and poly (4-styrenesulfonic acid) 704, respectively. In the acid polymer 702 and 704, the subscript n is an integer and is associated with the polymerization degree of the corresponding acid polymer. In some examples, the baking process has a baking temperature ranging between 80° C. and 250° C. and a baking duration ranging between 30 seconds and 180 seconds.

Figure 2D:
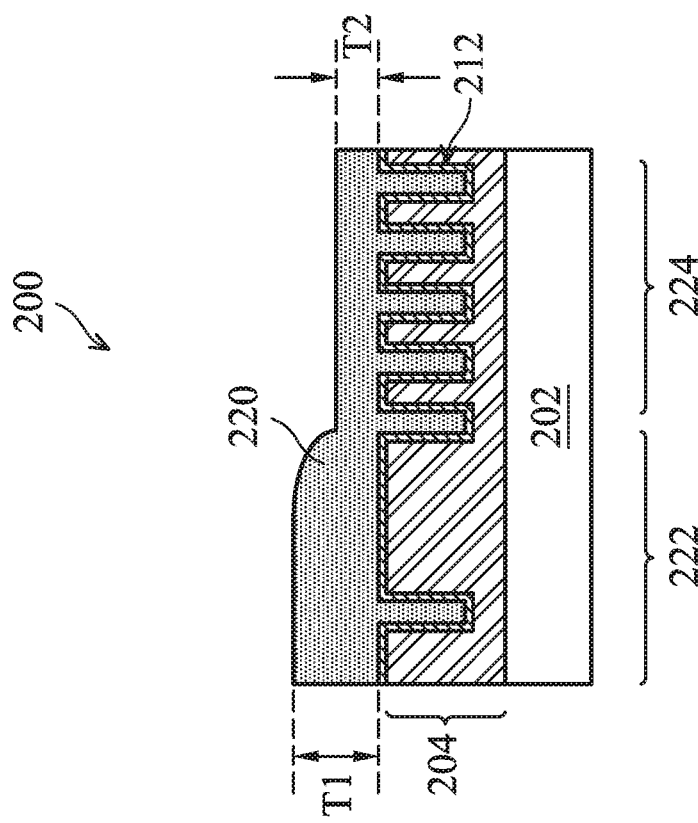
Figure 2C:
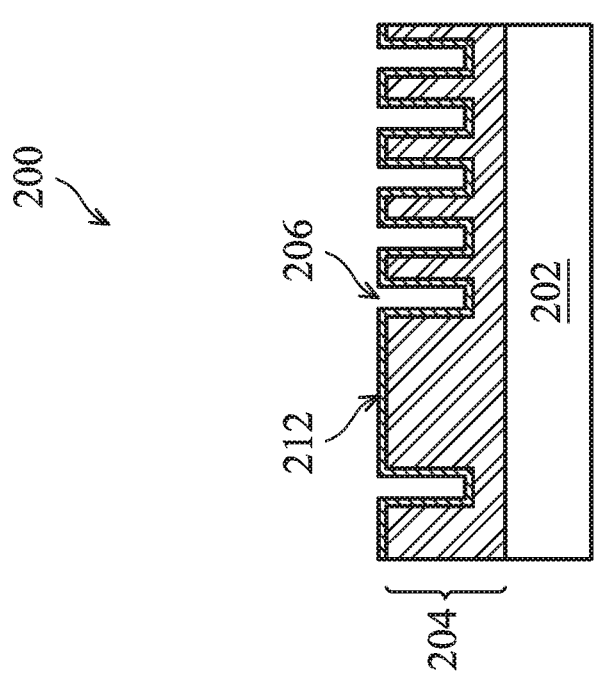

Referring now to FIG. 1 in conjunction with FIG. 2C, the method 100 proceeds to operation 106 to perform a first rinse to the acid solution 210, thereby removing the acid solution 210, leaving the acid layer 212 on the top surface of the pattern layer 204 including the surfaces of the trenches 206. The first rinse uses a solvent that includes at least one of functional groups: straight or cyclic alkene, alkyne, hydroxyl, ketone, aldehyde, carbonate, carboxylic acid, ester, ether, amide, amine, imine, imide, azide, nitrate, nitrile, nitrite and thiol according to some examples. In some examples, the rinse solution uses organic solvent, such as Dimethyl sulfoxide (DMSO), Tetrahydrofuran (THF), propylene glycol monomethyl ether (PGME), Propylene glycol monomethyl ether acetate (PGMEA), ethanol, propanol, butynol, methanol, ethylene glycol, gamabutylactone, N-Methyl-2-pyrrolidone (NMP), n-Butyl acetate (nBA), iso-propyl alcohol (IPA), or a mixture thereof. In some examples, the first rinse process has a rinse duration ranging between 30 seconds and 180 seconds. In other embodiments, the rinse process further includes a post rinse baking process. In some examples, the post rinse baking process has a baking temperature ranging between 80° C. and 150° C. and a baking duration ranging between 30 seconds and 180 seconds.

Referring now to FIG. 1 in conjunction with FIG. 2D, the method 100 proceeds to operation 108 to coat an acid sensitive material layer (or simply referred to as a material layer) 220 on the acid layer 212 by a proper technique, such as spin-on coating. The material layer 220 is sensitive to acid and reacts with acid from the acid layer 212, causing cross-linking reaction of the material layer 220. The material layer 220 is disposed over the top surface of the pattern layer 204 and fills in the trenches 206. Due to the loading effect, the top profile of the material layer 220 is not flat. For example, a portion of the material layer 220 in a region 222 with larger feature sizes has a thickness T1 above the trenches 206 while a portion of the material layer 220 in a region 224 with smaller feature sizes has a thickness T2 less than T1. This uneven profile is addressed by the disclosed method and is eliminated eventually. In the present embodiment, the material layer 220 is a polymer solution wherein the polymer is not cross-linked yet at this stage.

Figure 8B:
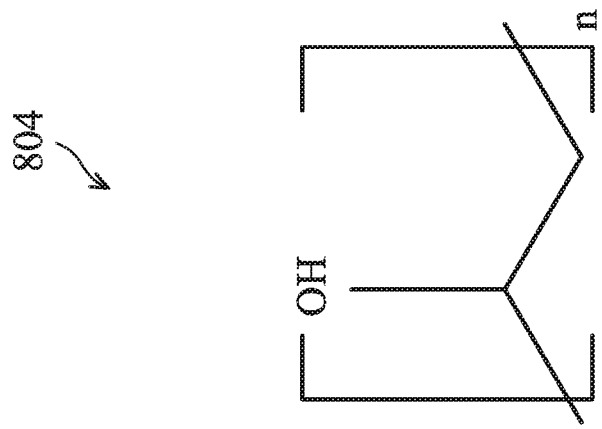
FIGS. 8A and 8B illustrate a chemical structure of a polymer in accordance with some embodiments.
Figure 8A:
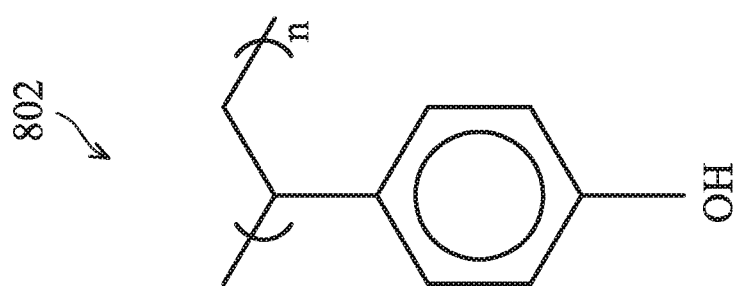
Figure 9B:
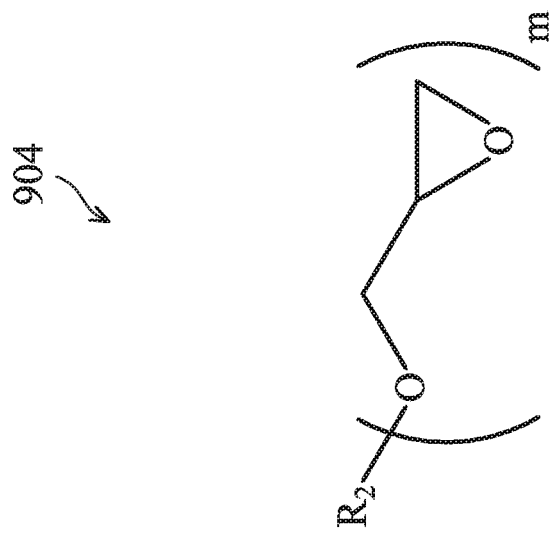
FIGS. 9A and 9B illustrate a chemical structure of a cross-linker in accordance with some embodiments.
Figure 9A:
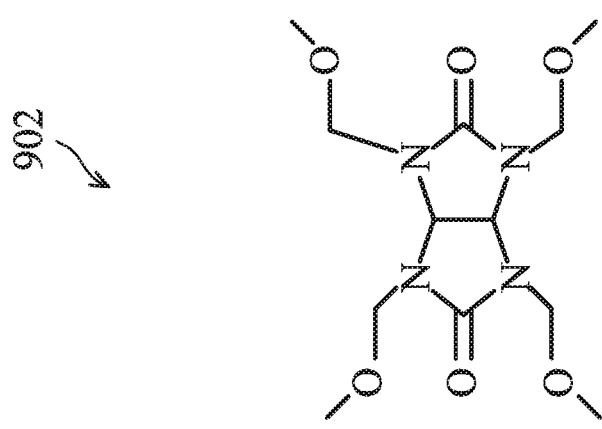

In some embodiments, the material layer 220 includes a polymer, such as polyhydroxy-styrene (PHS) 802 illustrated in FIG. 8A or polyvinyl alcohol (PVA) 804 illustrated in FIG. 8B. The polymer further include an acid-labile group (ALG) bonded thereon, wherein the ALG is sensitive to acid and has de-protection to the polymer to initiate cross-linking reaction in the presence of acid. The material layer 220 may include cross-linkable functionality that is cross-linked with the other cross-linkable functionality at the following treatment. In some examples, the functionality includes at least one of the glycidyl ether, alkyl oxide, alkene, alkyne, triazene, epoxide. The material layer 220 further includes a cross-linker, such as tetramethylolglycoluril (TMGU) 902 illustrated in FIG. 9A or epoxide 904 illustrated in FIG. 9B. The polymer and the cross-linker are mixed in a solvent, referred to as a pre-cross-linking solution before it is coated on the substrate. The material layer 220 may additionally include other chemical additives to enhance the cross-linking reaction.

Figure 2F:
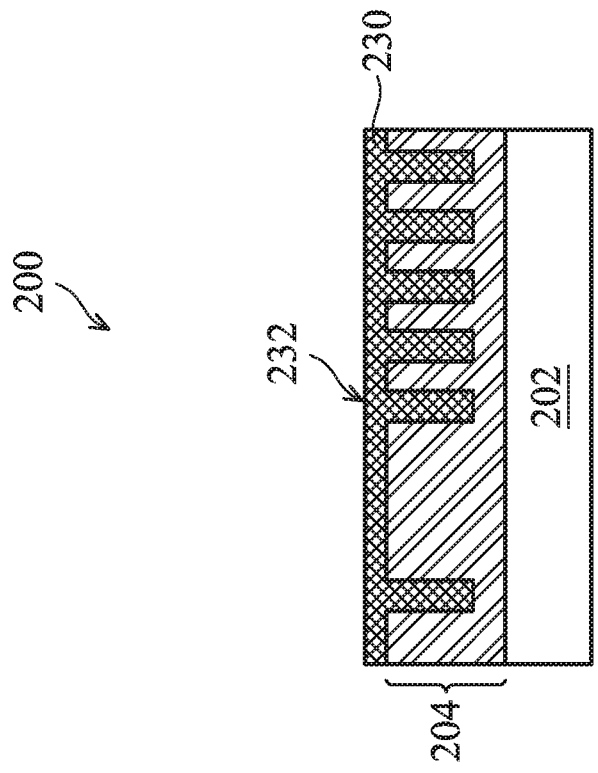
Figure 2E:
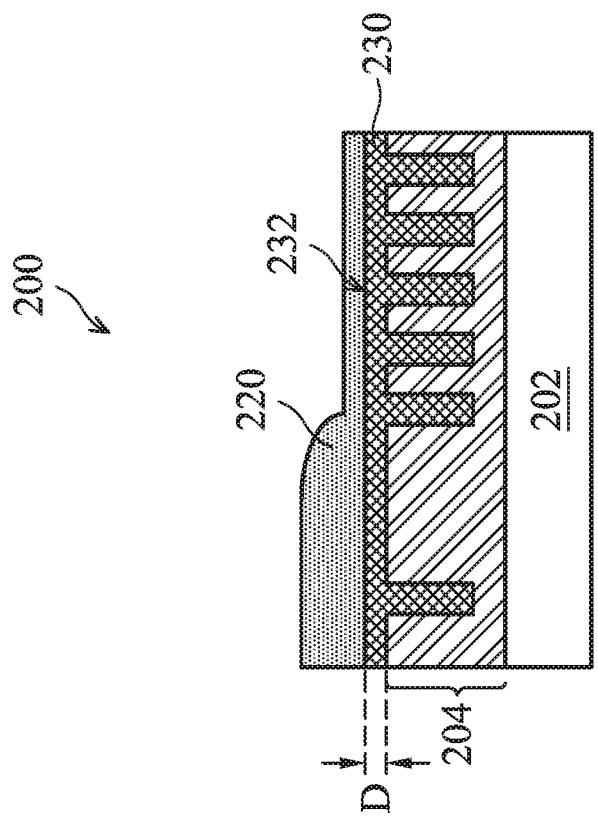

Referring now to FIG. 1 in conjunction with FIG. 2E, the method 100 includes an operation 110 to perform a treatment to the material layer 220. The treatment triggers the reactions between the polymer and the acid from the acid layer 212 such that the polymer in portions of the material layer 220 is cross-linked, forming a cross-linked polymer layer 230 as illustrated in FIG. 2E. In some embodiments, the treatment in the operation 108 is a thermal treatment, such as a baking process. In some examples, the baking process has a baking temperature ranging between 80° C. and 350° C. and a baking duration ranging between 30 seconds and 180 seconds. In some examples, the treatment in the operation 108 includes an electromagnetic wave treatment, which may include at least one of radio wave, microwave, infrared, visible light, ultra-violet. In this case, the treatment time ranges between 1 to 100 seconds, preferably in a range between 5 to 30 seconds. Since the acid layer 212 is only present on the surfaces of the pattern layer 204, including the surfaces of the trenches 206, the acid from the acid layer 212 diffuses to a certain distance in the material layer 220 during the baking process. This distance is determined by the diffusion length. If the diffusion distance during the baking process is substantially equal to or greater than the half width of the trenches 206, the portions of the polymer in the trenches 206 are cross-linked. The polymer in a sheet of the material layer 220 above the trenches 206 is cross-linked as well. The cross-linked sheet of the material layer 220 has a thickness D, determined by the diffusion distance. The thickness D is constant because of the intrinsic diffusion characteristics. Therefore, the cross-linked polymer layer 230 has a planarized top surface 232. Above the top surface 232 of the cross-linked polymer layer 230, the material layer 220 remains uncross-linked, as illustrated in FIG. 2E.

In alternative embodiment, acid from the acid layer 212 directly diffuses and reacts with the polymer to form the cross-linked polymer layer without the follow-up treatment. In this case, the treatment in the operation 110 may be skipped.

In other embodiments, the material layer 220 may utilize a photoresist material that employs the chemical amplification, therefore being referred to as a chemically amplified resist (CAR). However, photo acid generator (PAG) usually mixed with the polymer may be excluded since acid is present in the acid layer, not generated by the optical exposing process through PAG. In furtherance of the embodiments, the polymer includes an acid labile group (ALG) bonded thereto. The ALG is cleaved from the polymer in the presence of acid and de-protects the polymer such that the polymer is cross-linked by the cross-linker. Various negative tone CAR photoresist materials can be used here with or without PAG mixed therein.

Referring now to FIG. 1 in conjunction with FIG. 2F, the method 100 proceeds to operation 112 to perform a second rinse to the material layer 220, thereby removing uncross-linked portion, leaving the cross-linked polymer layer 230 on the pattern layer 204. As noted above, the cross-linked polymer layer 230 has a planarized top surface 232. In some embodiments, the second rinse is similar to the first rinse in the operation 106. For examples, the second rinse uses a solvent that includes at least one of functional groups: straight or cyclic alkene, alkyne, hydroxyl, ketone, aldehyde, carbonate, carboxylic acid, ester, ether, amide, amine, imine, imide, azide, nitrate, nitrile, nitrite and thiol according to some examples. In some examples, the rinse solution uses organic solvent, such as DMSO, THF, PGME, PGMEA, ethanol, propanol, butynol, methanol, ethylene glycol, gamabutylactone, NMP, nBA, IPA, and a mixture thereof. In some examples, the second rinse process has a rinse duration ranging between 30 seconds and 180 seconds. In other embodiments, the second rinse process further includes a post rinse baking process. In some examples, the post rinse baking process has a baking temperature ranging between 80° C. and 150° C. and a baking duration ranging between 30 seconds and 180 seconds.

Referring to FIG. 1, the method 100 may proceed further with other operations. For example, the method includes an operation 114 by performing a fabrication process to the semiconductor structure 200 utilizing the planarized top surface. In some examples, a photolithography process is implemented. A photoresist material is coated on the planarized top surface 232 by spin-on coating. A lithography procedure, including optical exposure, post exposure baking and developing, is followed to form a patterned photoresist layer, which will be used as an etch mask for etch or an implantation mask for ion implantation. The photoresist may implement dual-layer or tri-layer scheme. In this case, the cross-linked polymer layer 230 may be used as one of the dual layers or tri-layers.

In some other examples, the pattern layer 204 is an uneven material layer (such as ILD with an uneven surface after being deposited, or metal layer with uneven top surface in the damascene process) to be planarized. In this case, an etch back process or chemical mechanical polishing is applied to substantially etch both the cross-linked polymer layer 230 and the pattern layer 204 to recess until the cross-linked polymer layer 230 is completely removed, which results in a planarized top surface of the pattern layer 204. In other examples, this method may be used in forming fin active region, or shallow trench isolation features.

Figure 3:
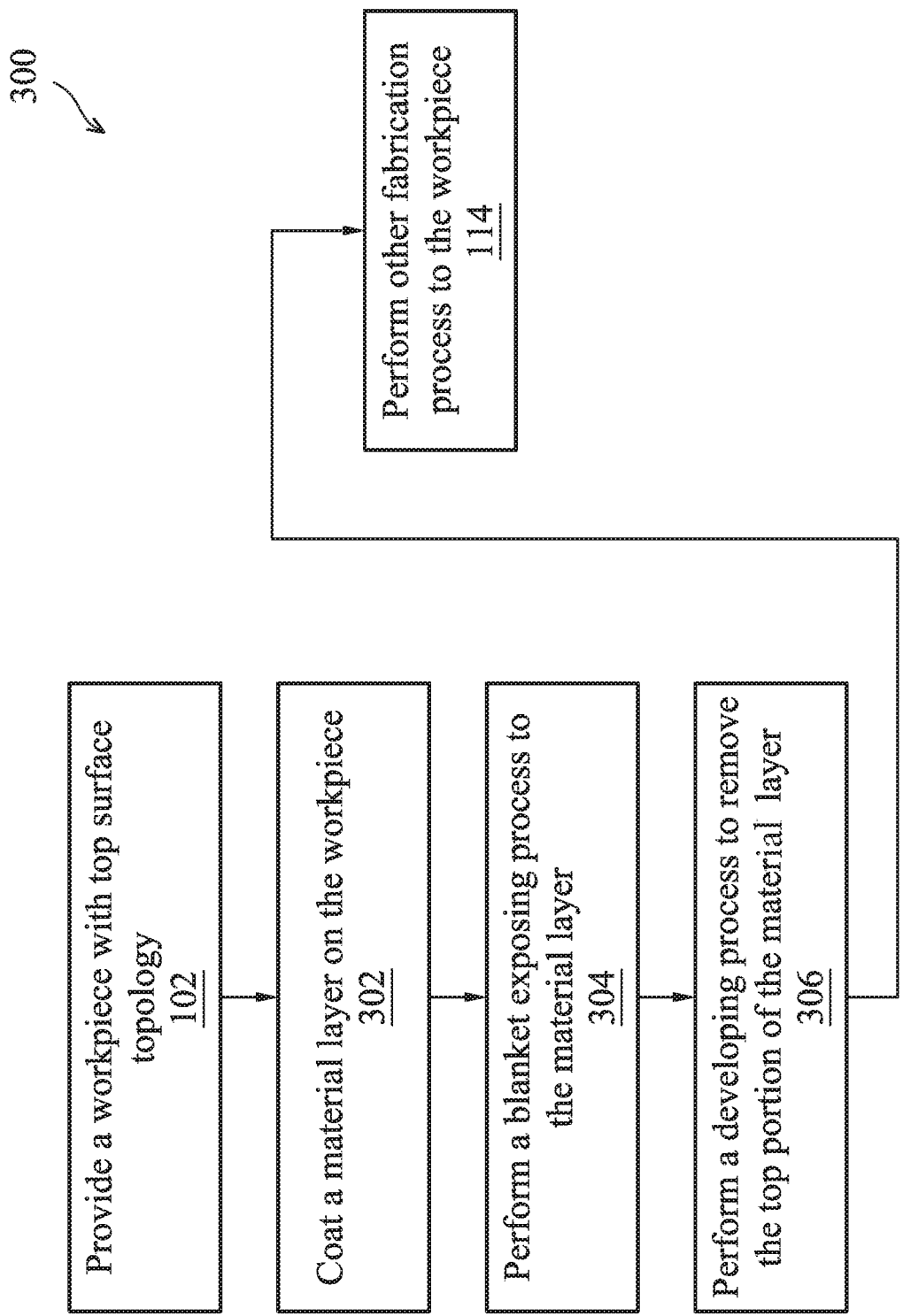
FIG. 3 illustrates a flow chart of a lithography patterning method in accordance with some embodiments.

FIG. 3 is a flow chart of a method 300 of patterning a substrate (e.g., a semiconductor wafer) according to various aspects of the present disclosure in some embodiments. Additional operations can be provided before, during, and after the method 300, and some operations described can be replaced, eliminated, or moved around for additional embodiments of the method.

FIGS. 4A through 4D are sectional views of a semiconductor structure 400 at various fabrication stages, constructed in accordance with some embodiments. The method 300 is described below in conjunction with FIG. 3 and FIGS. 4A through 4D wherein the semiconductor structure 400 is fabricated by using embodiments of the method 300. The semiconductor structure 400 may be an intermediate workpiece fabricated during processing of an IC, or a portion thereof, that may include logic circuits, memory structures, passive components, and active components such diodes, FETs, MOSFET, CMOS transistors, bipolar transistors, high voltage transistors, high frequency transistors, FinFETs, other 3D FETs, and combinations thereof.

Figure 4B:
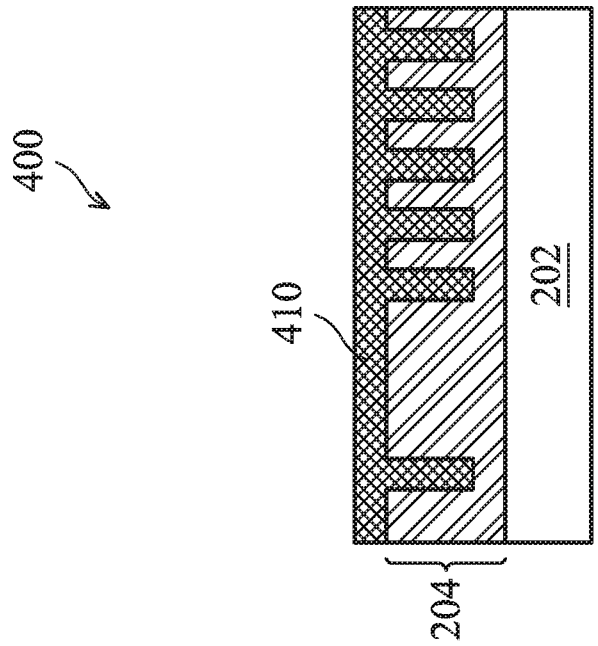
FIGS. 4A, 4B, 4C and 4D illustrate cross sectional views of a semiconductor structure at various fabrication stages, in accordance with some embodiments.
Figure 4A:
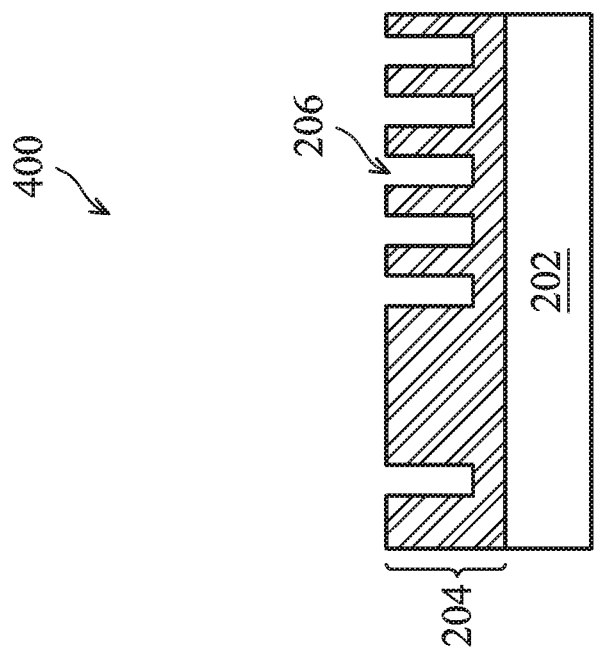

Referring now to FIG. 3 in conjunction with FIG. 4A, the method 300 begins at block 102 with a semiconductor structure 400. Referring to FIG. 4A, the semiconductor structure 400 includes a substrate 202. In an embodiment, the substrate 202 is a semiconductor substrate (e.g., wafer). For example, the substrate 202 includes silicon in a crystalline structure, or may include other elementary semiconductors. The substrate 202 includes one or more layers of material or composition. The substrate 202 may include epitaxial regions, include isolation regions, include doped regions, include one or more semiconductor devices or portions thereof, include conductive and/or non-conductive layers, and/or include other suitable features and layers.

A pattern layer 204 is disposed on the substrate 202. The pattern layer 204 includes various features separated by various trenches or recessed areas 206. Those features may have different shapes, dimensions, heights, and/or densities. In some examples, the pattern layer 204 may be semiconductor material, conductive material, or dielectric material.

Referring now to FIG. 3 in conjunction with FIG. 4B, the method 300 proceeds to operation 302 to coat photosensitive material layer 410 to the pattern layer 204 by a proper technique, such as spin-on coating. In the operation 302, the photosensitive material layer 410 is disposed on the pattern layer 204 and fills in the trenches 206. In the present embodiment, the photosensitive material layer 410 is a photoresist (or resist). The resist may be sensitive to light radiation, such as UV, DUV or EUV radiation (or alternatively other radiation, such as an electron beam). In some examples, the resist employs the chemical amplification mechanism, referred to as a chemically amplified resist (CAR). The resist 410 includes various chemical components mixed in to a solution when it is coated on. Various chemical in the CAR are described below.

Figure 10:
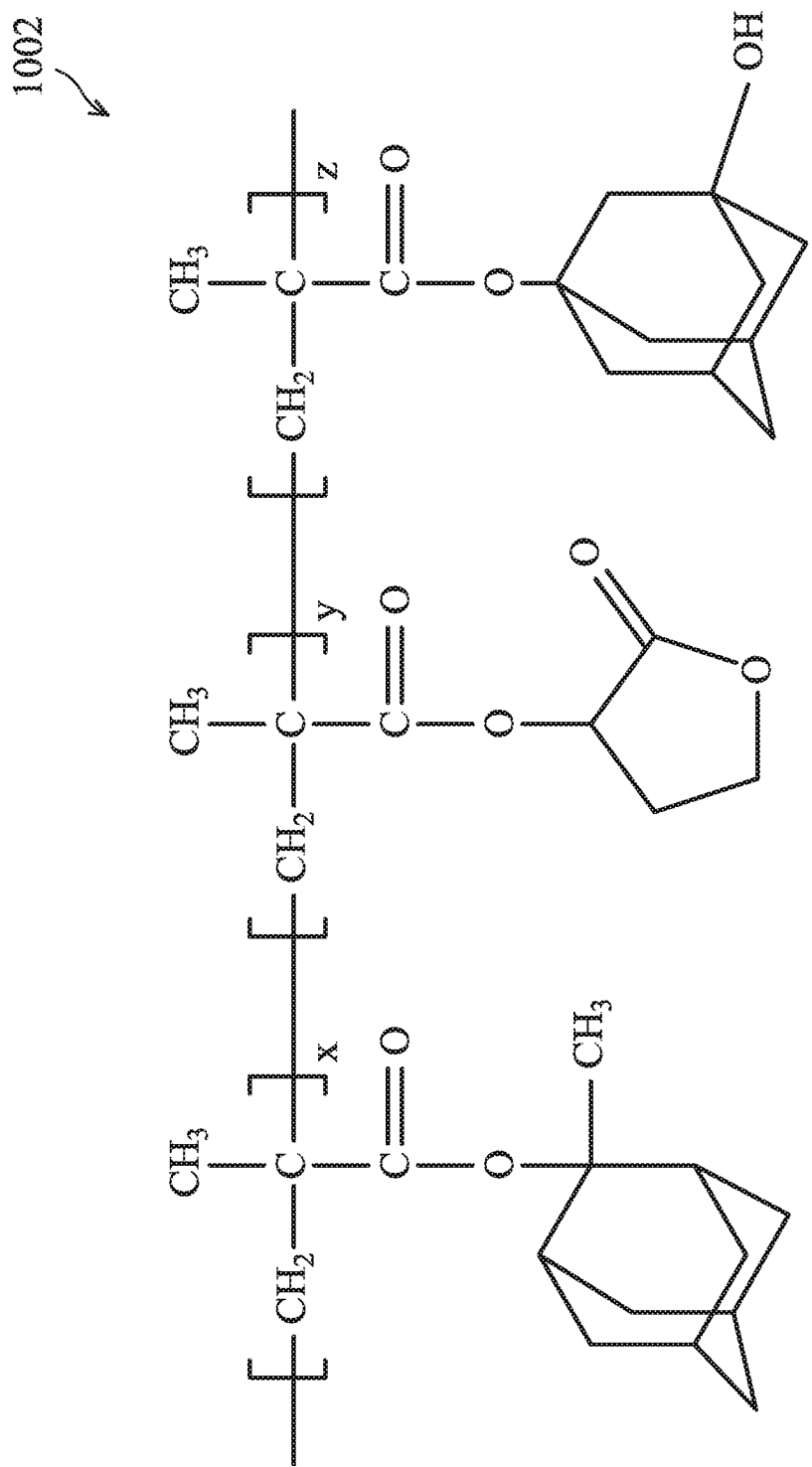
FIG. 10 illustrates s chemical structure of a polymer in accordance with some embodiments.

The resist 410 includes a polymeric material (simply polymer) that resists to etching during semiconductor fabrication. In various embodiments, the polymer includes a poly(norbornene)-co-malaic anhydride (COMA) polymer, a polyhydroxystyrene (PHS) polymer, or an acrylate-based polymer. For example, the acrylate-based polymer includes a poly (methyl methacrylate) (PMMA) polymer. FIG. 10 provides one exemplary chemical structure of the polymer, in which subscripts x, y and z are integers associated with the polymerization degree of the polymer.

The resist 410 includes an acid generating compound, such as PAG. The PAG absorbs radiation energy and generates acid. In some embodiments, the PAG may include a chemical structure, such as those 502 and 504 in FIGS. 5A and 5B. In some examples, the PAG includes a sulfonium cation, such as a triphenylsulfonium (TPS) group; and an anion, such as a triflate anion. In some examples, the anion includes a sulfonyl hydroxide or fluoroalky sulfonyl hydroxide.

The resist 410 further includes acid-labile group (ALG) or dissolution inhibitor bonded to the backbone of the polymer. The ALG chemically changes in response to acid. For example, the ALG is cleaved in the presence of acid so that the polarity of the resist is increased or alternatively decreased. Thus, the ALG is deprotected by PAG in exposed areas of the resist layer. The exposed resist changes the polarity and dissolubility. For example, the exposed resist material has an increased dissolubility in a developer (for a positive-tone resist) or decreased dissolubility in a developer (for a negative-tone resist). When the exposing dose of the lithography exposing process reaches a dose threshold, the exposed resist material will be dissoluble in the developer or alternatively the exposed resist material will be soluble in the developer. In one example, the ALG includes t-butoxy-cardbonyl (tBOC).

The resist 410 may further include other chemicals, such as quencher, sensitizer or both. Various chemical components are mixed in a solvent to form a resist solution when it is coated on. The solvent may be aqueous solvent or organic solvent. After the coating of the resist 410 on the substrate, soft baking may be performed to reduce solvent in the coated resist layer.

Figure 4D:
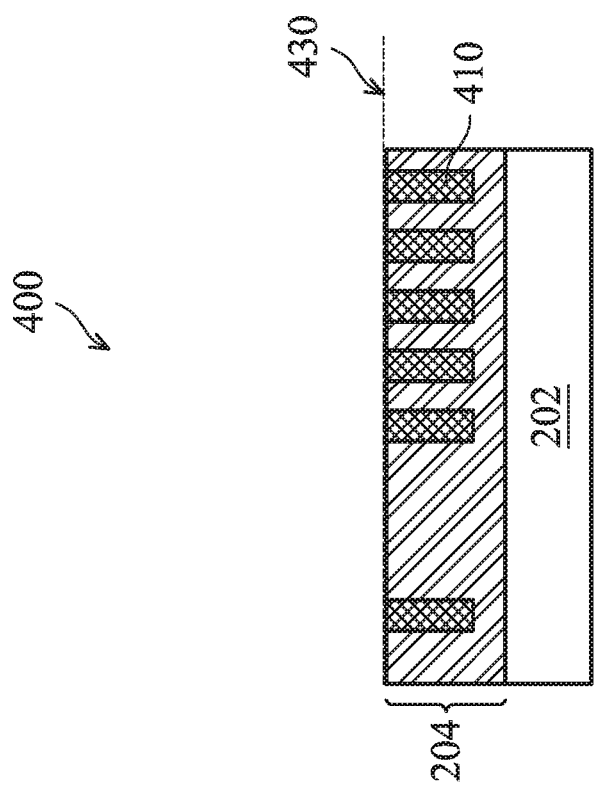
Figure 4C:
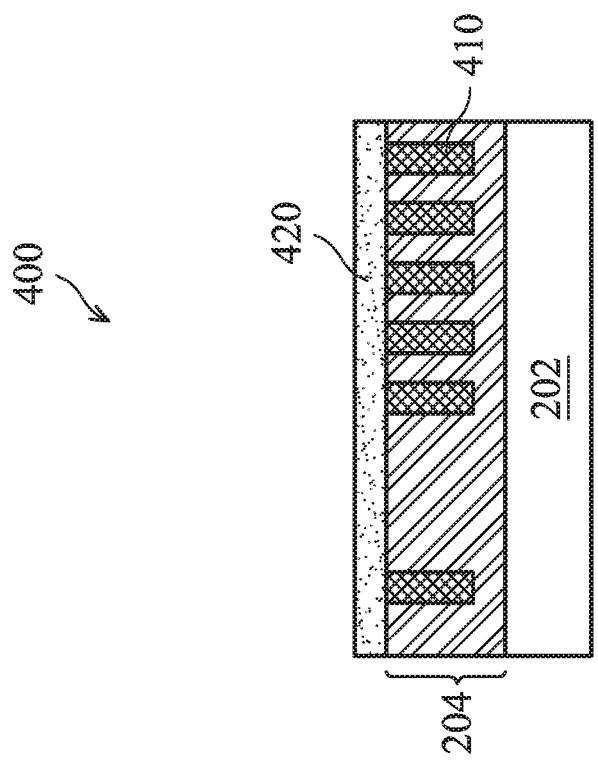

Referring to FIGS. 3 and 4C, the method 300 proceeds to an operation 304 to perform a blanket exposing process to the resist layer 410. The blanket exposing process is an optical exposing process without patterning (without using photomask for example). Therefore, the alignment or other corresponding procedure can be eliminated. Furthermore, a low cost and low resolution lithography projection system may be used to perform the blanket exposing process. The optical radiation used in the blanket optical exposing process may include UV, DUV or other suitable radiation, such as I-line light, a DUV light (e.g., 248 nm radiation by krypton fluoride (KrF) excimer laser or 193 nm radiation by argon fluoride (ArF) excimer laser). In some embodiments, the radiation is a EUV radiation (e.g., 13.5 nm). During the blanket exposing process, the PAG in the resist 410 releases acid. The acid triggers de-protection reaction with ALG bound polymer, creates carboxylic acid and achieves polar switch such that the polymer is dissoluble in a basicity solution.

The method 300 may further include a post-exposure baking (PEB) to amplify the acid reaction. During the PEB process, the ALG in the exposed resist material is cleaved, the exposed portions of the resist layer 208 are changed chemically (such as more hydrophilic or more hydrophobic). In a specific embodiment, the PEB process may be performed in a thermal chamber at temperature ranging between about 80° C. to about 160° C.

During the blanket exposing process, the top portions of the resist 410 above the trenches 206 are chemically changed because the exposing dose is above the exposure threshold, referred to as exposed portions 420. The portions of the resist 410 in the trenches 206 are unable to receive or unable to receive enough optical radiation when the trenches 206 have width less than a critical dimension. In some examples, the blanket exposing process is focused only on the top portions of the resist 410 such that only the top portions of the photosensitive material layer is exposed with a dose above an exposure threshold. Thus, the portions of the resist 410 in the trenches 206 are not dissolved in basicity solution.

Referring to FIG. 3 and FIG. 4D, the method 300 proceeds to an operation 306 to perform a developing process using a developer. In some embodiments, the developer is a base solution. In one example, the developer is tetramethyl ammonium hydroxide (TMAH) solution. As noted above, the exposed portions 420 are removed by the developer in the developing process, resulting in a planarized top surface 430, collectively defined by the pattern layer 204 and the unexposed portions of the resist 410. After the developing process, the remaining resist material in the trenches 206 as plug material improves iso-dense planarization performance. Here iso-dense refers to the pattern having isolated pattern regions and dense pattern regions with uneven pattern density.

Referring to FIG. 3, the method 300 may further other operations. For example, the method includes an operation 114 by performing a fabrication process to the semiconductor structure 400 utilizing the planarized top surface. In some examples, a photolithography process is implemented. A photoresist material is coated on the planarized top surface 430 by spin-on coating. A lithography procedure, including optical exposure, post exposure baking and developing, is followed to form a patterned photoresist layer, which will be used as an etch mask for etch or an implantation mask for ion implantation. The photoresist may implement dual-layer or tri-layer scheme.

Although not shown in FIG. 3, the method 300 may include other operations before, during or after the operations described above, such as operation 114. In an embodiment, the substrate 202 is a semiconductor substrate and the method 300 proceeds to forming FinFETs. In this embodiment, the method 300 includes forming a plurality of active fins in the semiconductor substrate 202. The advanced lithography process, method, and materials described above can be used in many applications, including FinFETs. For example, the fins may be patterned to produce a relatively close spacing between features, for which the above disclosure is well suited. In addition, spacers used in forming fins of FinFETs, also referred to as mandrels, can be processed according to the above disclosure.

The present disclosure provides a method for improved planarization performance, which will enhance and improve the subsequent fabrication, such as lithography patterning, chemical mechanical polishing, or fin-type active region formation. Especially, the method provides a planarized top surface through activation treatment, such as acid treatment or a blanket exposing process associated with corresponding material layers, such as acid sensitive material or photosensitive material layer.

Thus, the present disclosure provides a method for planarization in accordance with some embodiments. The method includes providing a substrate having a top surface and a trench recessed from the top surface; coating a sensitive material layer on the top surface of the substrate, wherein the sensitive material layer fills in the trench; performing an activation treatment to the sensitive material layer so that portions of the material layer are chemically changed; and performing a wet chemical process to the sensitive material layer so that top portions of the sensitive material layer above the trench are removed, resulting in a planarized surface.

The present disclosure provides a method for planarization in accordance with some other embodiments. The method includes providing a substrate having a recessed trench; coating a photosensitive material layer on a top surface of the substrate and the recessed trench; performing a blanket exposing process to the photosensitive material layer such that only a top portion of the photosensitive material layer is exposed with a dose above an exposure threshold; and performing a developing process to the photosensitive layer, thereby removing the top portion of the photosensitive layer.

The present disclosure provides a method for planarization in accordance with some other embodiments. The method includes providing a substrate having a recessed trench; performing an acid treatment to the substrate and the recess trench; performing a first rinse process to a top surface and the recessed trench of the substrate, thereby forming an acid layer conformal to the substrate; coating an acid sensitive material layer on the top surface of the substrate, wherein the material layer directly contacts the acid layer on the top surface and recessed trench of the substrate; performing a treatment to the material layer so that the portions of the material closing to the acid layer are chemically changed; and performing a second rinse process to the material layer so that unchanged portions of the material layer are removed by the second rinse process, resulting in a planarized top surface.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method for integrated circuit fabrication, comprising:
   providing a substrate having a top surface and a trench recessed from the top surface;
   forming an acid layer conformal to the top surface of the substrate and the trench;
   coating a sensitive material layer over the substrate, wherein the sensitive material layer substantially fills the trench and directly contacts the acid layer such that, without performing a treatment to trigger reactions between the acid layer and the sensitive material layer, a first portion of the sensitive material layer disposed within the trench and a second portion of the sensitive material layer disposed above the top surface are cross-linked, wherein a third portion of the sensitive material layer disposed above the second portion remains uncross-linked; and performing a wet chemical process to the sensitive material layer, the wet chemical process removing the third portion of the sensitive material layer thereby exposing the cross-linked second portion.

2. The method of claim 1, wherein the forming of the acid layer comprises:

performing an acid treatment to the top surface of the substrate and the trench; and after the performing of the acid treatment, performing a first rinse process to the top surface of the substrate and the trench, thereby resulting in the acid layer on the substrate and the trench.

3. The method of claim 2, wherein the coating of the sensitive material layer includes coating an acid sensitive material layer directly on the acid layer.

4. The method of claim 3, wherein:

the acid sensitive material layer includes a polymeric material.

5. The method of claim 2, wherein the wet chemical process is a second rinse process, wherein at least one of the first and second rinse processes uses a chemical solution chosen from Dimethyl sulfoxide (DMSO), Tetrahydrofuran (THF), propylene glycol monomethyl ether (PGME), Propylene glycol monomethyl ether acetate (PGMEA), ethanol, propanol, butynol, methanol, ethylene glycol, gamabutylactone, N-Methyl-2-pyrrolidone (NMP), n-Butyl acetate (nBA), isopropyl alcohol (IPA), and a mixture thereof.

6. The method of claim 2, wherein the sensitive material layer includes a polymeric material with acid-labile group bonded thereon and a cross-linker.

7. The method of claim 6, wherein the polymeric material includes one of polyhydroxy-styrene (PHS) and polyvinyl alcohol (PVA).

8. The method of claim 6, wherein the cross-linker includes one of tetramethylolglycoluril (TMGU) and epoxide.

9. A method for integrated circuit fabrication, comprising:

providing a substrate having a recessed trench;

applying an acid solution to the substrate;

performing a first treatment to the acid solution to release acid;

forming an acid layer from the acid solution, the acid layer being conformal to the substrate;

after the performing of the first treatment, coating an acid sensitive material layer on a top surface of the substrate, wherein the acid sensitive material layer directly contacts the acid layer;

performing a second treatment to the acid sensitive material layer so that portions of the acid sensitive material layer proximate to the acid layer within the recessed trench are cross-linked thereby forming a cross-linked material layer within the recessed trench while other portions of the acid sensitive material layer disposed outside the recessed trench remain uncross-linked; and performing a rinse process to the acid sensitive material layer so that the other portions of the acid sensitive material layer disposed outside the recessed trench are removed.

10. The method of claim 9, wherein the acid sensitive material layer includes a polymeric material with an acid-labile group bonded thereon and a cross-linker; and the second treatment includes a treatment that enables cross-linking reaction of the polymeric material by acid.

11. The method of claim 10, wherein the polymeric material includes one of polyhydroxy-styrene (PHS) and polyvinyl alcohol (PVA); and the cross-linker includes one of tetramethylolglycoluril (TMGU) and epoxide.

12. The method of claim 9, wherein the second treatment includes a thermal baking process with a baking temperature ranging between 80° C. and 350° C.

13. The method of claim 9, wherein the second treatment includes an electromagnetic radiation treatment using an electromagnetic radiation chosen from radio wave, microwave, infrared, and visible light.

14. The method of claim 9, wherein the acid solution is a solution that includes photo-acid generator (PAG).

15. The method of claim 14, wherein the first treatment comprises a blanket exposing process.

16. A method for integrated circuit fabrication, comprising:

providing a substrate having a top surface and a trench recessed from the top surface;

applying an acid solution to the substrate, a portion of the acid solution forming an acid layer conformal to the top surface and the trench;

performing a first treatment to the acid solution to release acid;

after the performing of the first treatment, rinsing the acid solution thereby removing the acid solution from the substrate without removing the acid layer;

after the rinsing of the acid solution, coating an acid sensitive material layer on the acid layer, wherein the acid sensitive material layer directly contacts the acid layer;

performing a second treatment to the acid sensitive material layer thereby cross-linking a first portion of the acid sensitive material layer, wherein a second portion of the acid sensitive material layer remains uncross-linked; and rinsing the acid sensitive material layer thereby removing the second portion.

17. The method of claim 16, wherein the performing of the second treatment causes diffusion of acid from the acid layer into the acid sensitive material layer thereby causing the cross-linking of the first portion.

18. The method of claim 16, wherein the cross-linked first portion includes a cross-linked sheet formed above the top surface of the substrate, the cross-linked sheet having a planar top surface.

19. The method of claim 16, wherein the second portion directly contacts the first portion without contacting the acid layer.

20. The method of claim 16, wherein a diffusion distance of the acid from the acid layer is controlled by an intrinsic diffusion characteristic.

* * * * *